(12) United States Patent
Suwald (10) Patent No.: US 11,100,380 B2
(45) Date of Patent: Aug. 24, 2021

(54) ELECTRONIC DEVICE

(71) Applicant: NXP B.V., Eindhoven (NL)

(72) Inventor: Thomas Suwald, Hamburg (DE)

(73) Assignee: NXP B.V., Eindhoven (NL)

( * ) Notice: Subject to any disclaimer, the term of this patent is extended or adjusted under 35 U.S.C. 154(b) by 560 days.

(21) Appl. No.: 15/135,669

(22) Filed: Apr. 22, 2016

(65) Prior Publication Data
US 2016/0313830 A1    Oct. 27, 2016

(30) Foreign Application Priority Data

Apr. 24, 2015  (EP) .................................... 15165094

(51) Int. Cl.
| | | |
|---|---|---|
| *G06K 19/073* | (2006.01) | |
| *G06K 19/077* | (2006.01) | |
| *H05K 1/02* | (2006.01) | |
| *H05K 1/11* | (2006.01) | |

(52) U.S. Cl.
CPC ..... *G06K 19/07345* (2013.01); *G06K 19/077* (2013.01); *G06K 19/07749* (2013.01); *H05K 1/0296* (2013.01); *H05K 1/111* (2013.01); *G06F 2203/04103* (2013.01); *H05K 2201/0129* (2013.01)

(58) Field of Classification Search
CPC ........ G06F 3/044; H05K 1/0296; H05K 1/11; G06K 19/07345; G06K 19/07749; G06K 19/077
See application file for complete search history.

(56) References Cited

U.S. PATENT DOCUMENTS

| | | | |
|---|---|---|---|
| 5,930,304 A * | 7/1999 | Hollenbeck | G06K 13/077 375/259 |
| 6,036,099 A * | 3/2000 | Leighton | B32B 37/185 156/154 |
| 6,424,029 B1 | 7/2002 | Giesler | |
| 6,698,089 B2 | 3/2004 | Finn et al. | |
| 8,952,911 B2 | 2/2015 | van Lieshout et al. | |
| 9,898,695 B2 | 2/2018 | Suwald | |
| 9,916,053 B2 | 3/2018 | Suwald | |
| 9,977,061 B2 | 5/2018 | Suwald | |
| 2003/0226901 A1* | 12/2003 | Kim | G06K 19/07745 235/492 |
| 2009/0123743 A1 | 5/2009 | Shafran et al. | |
| 2012/0255846 A1 | 10/2012 | Demma | |
| 2012/0305654 A1* | 12/2012 | Wang | G06K 19/0707 235/492 |
| 2013/0169294 A1* | 7/2013 | Bollesen | G06F 3/044 324/658 |

(Continued)

FOREIGN PATENT DOCUMENTS

| | | |
|---|---|---|
| CN | 102156564 A | 8/2011 |
| DE | 19525933 C5 | 2/2004 |

(Continued)

*Primary Examiner* — Hang Lin (57) ABSTRACT

According to a first aspect of the present disclosure an electronic device is provided, which comprises a non-conductive substrate and a touch-based user interface unit having a capacitive sensor structure, wherein said capacitive sensor structure comprises conductive wires embedded in the non-conductive substrate. According to a second aspect of the present disclosure a corresponding method of manufacturing an electronic device is conceived.

23 Claims, 7 Drawing Sheets

(56) References Cited

U.S. PATENT DOCUMENTS

| | | | |
|---|---|---|---|
| 2014/0118633 A1* | 5/2014 | Chang | G06F 3/044 |
| | | | 349/12 |
| 2014/0176819 A1* | 6/2014 | Yilmaz | G06F 1/1692 |
| | | | 349/12 |
| 2015/0021402 A1 | 1/2015 | Finn et al. | |

FOREIGN PATENT DOCUMENTS

| | | | | |
|---|---|---|---|---|
| EP | 0946926 B1 | | 10/1999 | |
| EP | 2567349 | | 3/2013 | |
| EP | 2667156 | * | 11/2013 | G06F 3/044 |
| EP | 2696256 A2 | | 2/2014 | |

* cited by examiner

ELECTRONIC DEVICE

CROSS-REFERENCE TO RELATED APPLICATIONS

This application claims the priority under 35 U.S.C. § 119 of European patent application no. 15165094.2, filed on Apr. 24, 2015, the contents of which are incorporated by reference herein.

FIELD

The present disclosure relates to an electronic device. Furthermore, the present disclosure relates to a corresponding method of manufacturing an electronic device.

BACKGROUND

Today, electronic devices such as smart cards are widely used in society. For example, smart cards may be used as electronic identity (eID) cards. The end-user acceptance of such eID cards, however, is still relatively low. Although the eID cards are relatively secure, due to their cryptographic capabilities, they are usually not equipped with a user interface suitable for entering user credentials, i.e. a so-called "authentication interface". As a consequence, the majority of eID users still enter their PIN code through personal computers and laptops, which increases the risk that their credentials are intercepted by malicious software such as Trojans and key-logger programs. Some smart cards have been equipped with embedded touch-based user interfaces, such as capacitive sensor structures. However, due to form factor and manufacturing constraints, it is relatively difficult and expensive to integrate a touch-based user interface into a smart card.

SUMMARY

According to a first aspect of the present disclosure an electronic device is provided, which comprises a non-conductive substrate and a touch-based user interface unit having a capacitive sensor structure, wherein said capacitive sensor structure comprises conductive wires embedded in the non-conductive substrate.

In one or more embodiments, said capacitive sensor structure comprises a pair of adjacent conductive wires embedded in the non-conductive substrate, and each of said adjacent conductive wires functions as an electrode in the touch-based user interface unit.

In one or more embodiments, at least some of said conductive wires are arranged in a meander pattern.

In one or more embodiments, at least some of said conductive wires are arranged in a spiral pattern.

In one or more embodiments, said capacitive sensor structure further comprises wire terminals embedded in the non-conductive substrate.

In one or more embodiments, the device further comprises a communication and processing module having contact pads, wherein the wire terminals are connected to said contact pads.

In one or more embodiments, the wire terminals have been prepared for connection to the contact pads by carrying out a milling process.

In one or more embodiments, the device further comprises an antenna embedded in the non-conductive substrate.

In one or more embodiments, the conductive wires are made of the same material as said antenna.

In one or more embodiments, the device has been provided with the antenna and with the touch-based user interface unit in a single manufacturing step.

In one or more embodiments, the conductive wires are insulated conductive wires.

In one or more embodiments, the non-conductive substrate is a thermoplastic substrate.

In one or more embodiments, the conductive wires are copper wires.

In one or more embodiments, the device is a smart card.

According to a second aspect of the present disclosure a method of manufacturing an electronic device is conceived, the method comprising providing the electronic device with anon-conductive substrate and providing the electronic device with a touch-based user interface unit having a capacitive sensor structure, wherein said capacitive sensor structure is formed by embedding conductive wires into the non-conductive substrate.

DESCRIPTION OF DRAWINGS

Embodiments will be described in more detail with reference to the appended drawings, in which.

DESCRIPTION OF EMBODIMENTS

Figure 1:
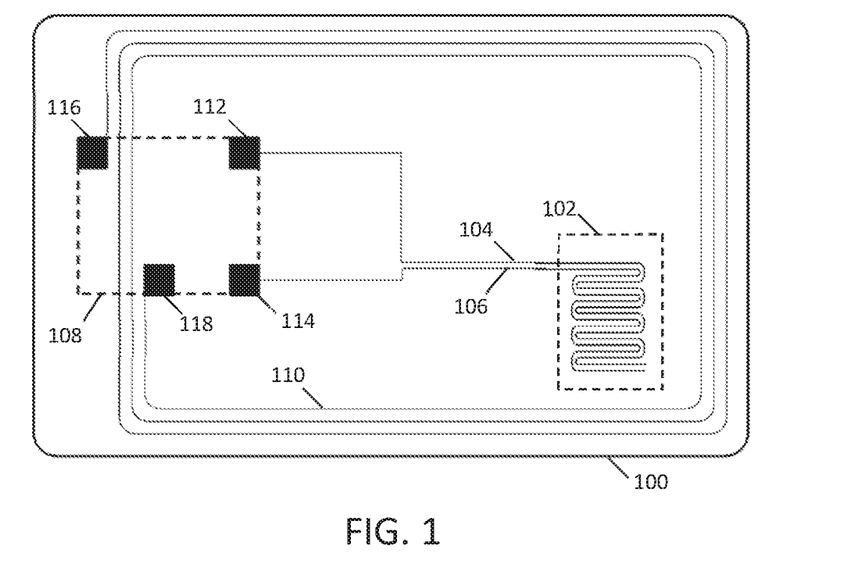
FIG. 1 shows an illustrative embodiment of an electronic device.

FIG. 1 shows an illustrative embodiment of an electronic device 100. The electronic device 100 may be a smart card, for example. As mentioned above, manufacturing the electronic device comprises providing it with anon-conductive substrate and with a touch-based user interface unit having a capacitive sensor structure. Furthermore, the capacitive sensor structure is formed by embedding conductive wires into the non-conductive substrate. In this example, a pair of adjacent conductive wires 104, 106 forms a capacitive sensor structure 102. Furthermore, the conductive wires 104, 106 are connected to contact pads 112, 114 of a communication and processing module 108 of the electronic device 100. The electronic device 100 also comprises an antenna 110 for wireless communication which is connected to the communication and processing module 108 through contact pads 116, 118. In this case, the capacitive sensor structure 102 comprises a single capacitive sensor implemented by said conductive wires 104, 106. The capacitive sensor structure 102 may be used to sense a relatively simple activity, such as pressing a button. Accordingly, the user interface unit may implement a button that may be touched by a user. Since the capacitive sensor structure 102 is formed by embedding conductive wires 104, 106 into the non-conductive substrate, relatively expensive etched, printed or galvanic inlays for supporting said structure 102 are no longer necessary. The conductive wires 104, 106 may, for example, be embedded into the same non-conductive substrate as the antenna 110, which may enable both a low-cost implementation and higher production efficiency. The conductive wires 104, 106 are arranged in a meander pattern, which may increase the sensitivity of the capacitive sensor. Alternatively, in case of a single capacitive sensor, the conductive wires 104, 106 may be arranged in a spiral pattern (not shown) which may also yield a relatively high sensitivity.

Figure 2:
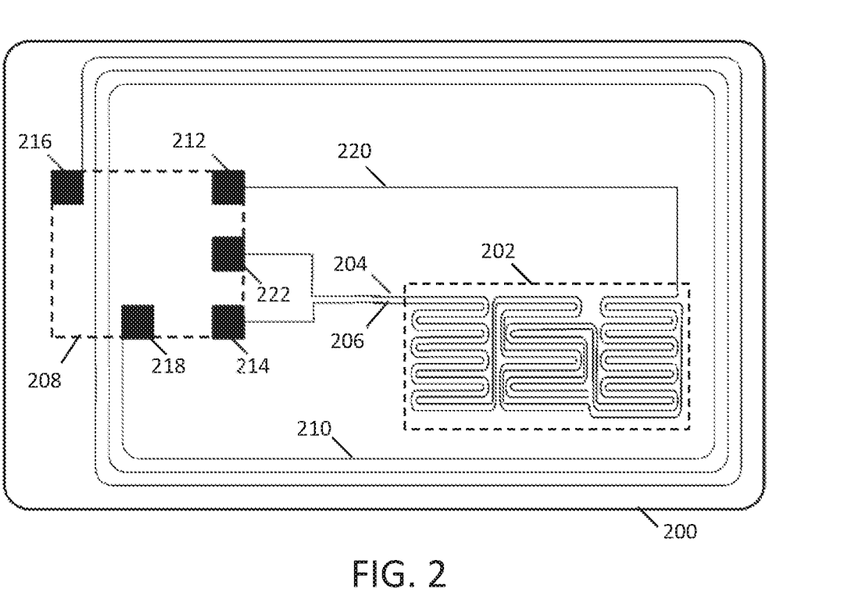
FIG. 2 shows a further illustrative embodiment of an electronic device.

FIG. 2 shows a further illustrative embodiment of an electronic device 200. The electronic device 200 may be a smart card, for example. In this embodiment, the electronic device 200 comprises a capacitive sensor structure 202 comprises two capacitive sensors which are formed by arranging three conductive wires 204, 206, 220 in such a way that each one of said wires is adjacent to another one of said wires. In this example, the capacitive sensor structure 202 comprises three sections: a left section which is only covered by one of said sensors, a right section which is only covered by the other sensor, and a middle section which is covered by both sensors in an interleaved manner. This sensor arrangement may be used to sense a more complex movement, for example a gesture such as a swipe. The conductive wires 204, 206, 220 are connected to contact pads 212, 214, 222 of a communication and processing module 208 of the electronic device 200. Furthermore, the electronic device 200 comprises an antenna 210 which is connected to the communication and processing module 208 through contact pads 216, 218. Again, the conductive wires 204, 206, 220 may, for example, be embedded into the same non-conductive substrate as the antenna 210.

Figure 6:
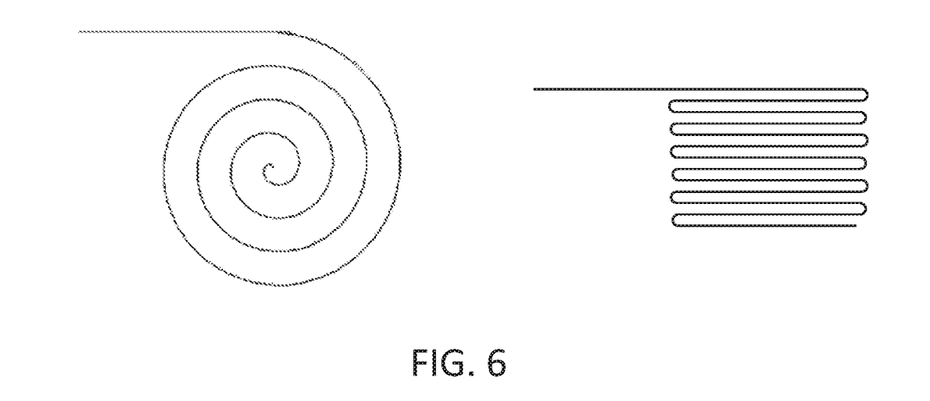
FIG. 6 shows illustrative embodiments of wire terminals.

The communication and processing module 208 may be arranged on the substrate in a first manufacturing step and the wires 204, 206, 220 may be arranged on the substrate in a second manufacturing step wherein the wires 204, 206, 220 may be connected to the contact pads 212, 214, 222 at the beginning of the second manufacturing step by carrying out a process such as soldering, welding, conductive gluing or mechanical clamping. In case the wires are arranged on the substrate in a first manufacturing step, the wires may be provided with terminals as shown in FIG. 6, which may be configured as a spiral or meander pattern forming a connection pad. In that case, the communication and processing module 208 may be arranged in a second manufacturing step and connected by, e.g., soldering or gluing its contact pads 212, 214, 222 to the terminals after they have been de-insulated.

Figure 3:
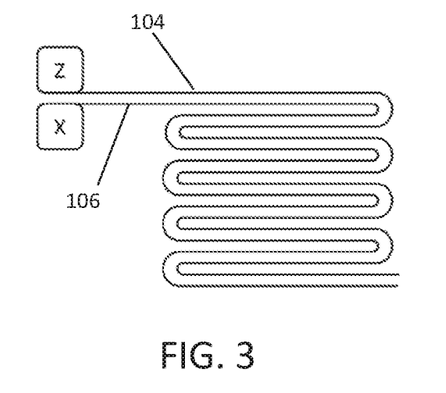
FIG. 3 shows an illustrative embodiment of a capacitive sensor.

FIG. 3 shows an illustrative embodiment of a capacitive sensor. In particular, a capacitive sensor realized by a pair of adjacent conductive wires 104, 106 is shown, which may be used in a capacitive sensor structure 102 as shown in FIG. 1, for example, Each conductive wire 104, 106 may function as an electrode in the touch-based user interface unit. For example, wire 104 may function as a Z-electrode and wire 106 as an X-electrode.

Figure 4:
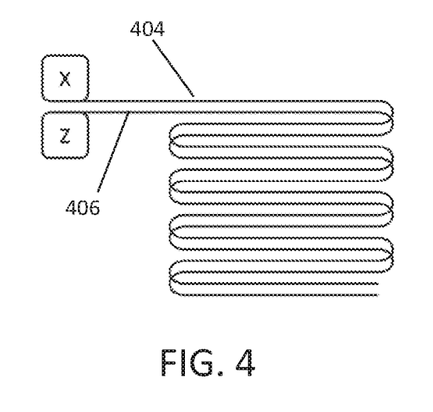
FIG. 4 shows a further illustrative embodiment of a capacitive sensor.

FIG. 4 shows a further illustrative embodiment of a capacitive sensor. In this example, a capacitive sensor is realized by a pair of adjacent insulated conductive wires 404, 406. Since the conductive wires 404, 406 are insulated wires they may cross each other without causing short circuits, which may result in the pattern shown in FIG. 4, for example. Such a pattern may result in better area utilization and, more specifically, in a higher sensor capacitance per area.

Figure 5:
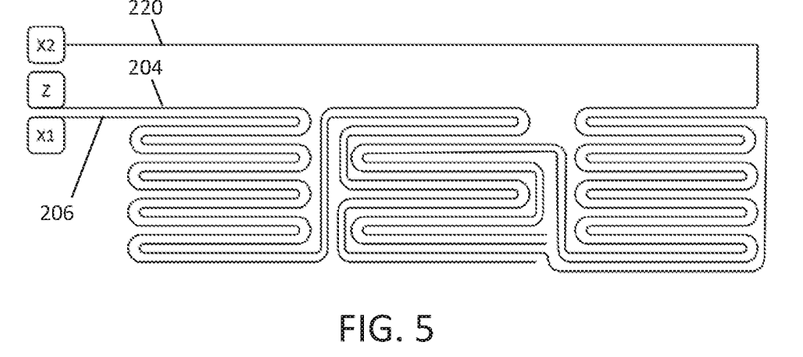
FIG. 5 shows an illustrative embodiment of a capacitive sensor structure comprising two capacitive sensors.

FIG. 5 shows an illustrative embodiment of a capacitive sensor structure comprising two capacitive sensors. In particular, two capacitive sensors are shown which are formed by arranging three conductive wires 204, 206, 220 in such a way that each one of said wires is adjacent to another one of said wires. The capacitive sensors may be used in a capacitive sensor structure 202 as shown in FIG. 2, for example. Each conductive wire 204, 206, 220 may function as an electrode in the touch-based user interface unit. For example, wire 204 may function as a Z-electrode, wire 206 as an X1-electrode, and wire 220 as an X2-electrode. As mentioned above, this sensor arrangement may be used to sense a more complex movement, for example a swipe, FIG. 6 shows illustrative embodiments of wire terminals. In particular, a wire terminal having a spiral pattern is shown, and a wire terminal having a meander pattern. Wire terminals having a spiral pattern or a meander pattern facilitate connecting the conductive wires to the communication and processing module during manufacturing of the electronic device, and may provide a good connection within a limited interface area. However, the skilled person will appreciate that other patterns may also be used for the wire terminal.

Figure 7:
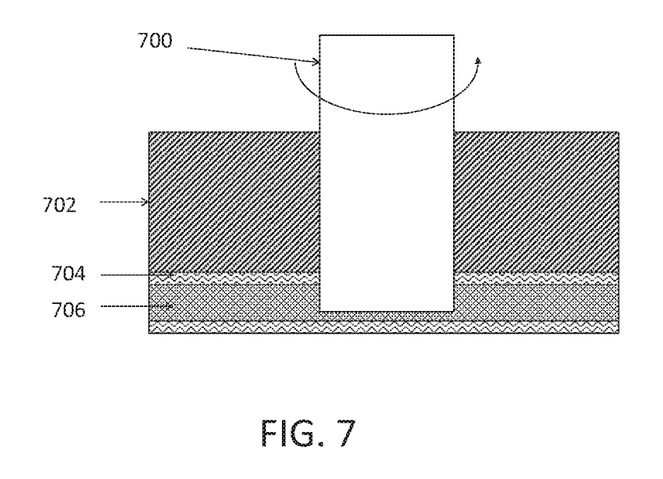
FIG. 7 shows an illustrative embodiment of a milling process.

FIG. 7 shows an illustrative embodiment of a milling process. The milling process comprises milling, by a milling tool 700, an opening into a card body 702, into an insulation layer 704 of a wire 706 and into a part of said wire 706. The milling process may partly remove the insulation of the wire in order to form a wire terminal, for example. According to a common card manufacturing method, the wire structures are formed first, then the card is laminated, then an opening is milled for inserting the communication and processing module into the card, and finally the communication and processing module is inserted (i.e. assembled) into the card. Thus, the milling process may serve the purposes of creating a cavity for the communication and processing module and also for partially removing the insulation from the wire terminals in order to prepare them for connection processes such as soldering and gluing. In case of soldering with, e.g., low-temperature Sn—Bi solder the required heat may be applied from the contact-pad side through the module. Another assembly process may apply anisotropic conductive film or glue to the module before inserting it into the milled cavity. Yet another assembly process may apply isotropic glue in combination with, e.g., epoxy-based glue that provides a stable fix of the module to the card body. In this case the glue is activated by applying heat to the contact-pad side, e.g., through heat available in a lamination process or by a focused infrared beam.

Figure 8:
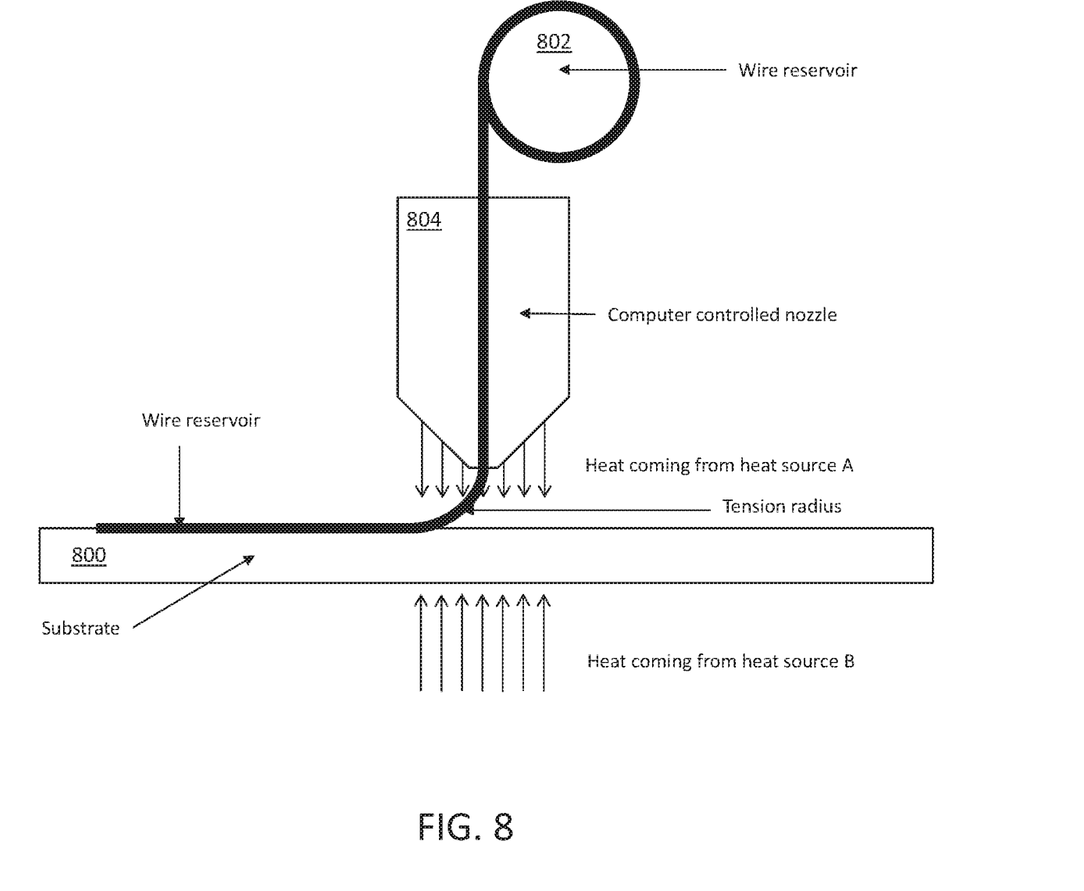
FIG. 8 shows an illustrative embodiment of a wire-embedding process.

FIG. 8 shows an illustrative embodiment of a wire-embedding process. The wire-embedding process comprises embedding wire from a wire reservoir 802 into a non-conductive substrate 800 through a computer-controlled nozzle 804. In particular, the sensing capacitors may be manufactured by applying copper wire that is supplied from the wire reservoir 802 though the nozzle 804 under application of heat and force to the substrate 800. The substrate 800 may be a thermoplastic card material, such as polyvinyl chloride (PVC) or polyethylene terephthalate (PET), which may facilitate the embedding process. The position and movement of the nozzle may be controlled by a computer in the three-dimensional space. The heat may be applied, for example, by inductive heating, ultrasonic heating, focused infrared light heating or electro-resistive heating. The heat may be applied from the wire-application side but also from underneath the substrate 800 in order to reduce the amount of heat required for softening the substrate material. The wire radius (tension radius) that develops during application of the wire is used to forward the force from the nozzle 804 to the wire and to the substrate 800 in order to facilitate embedding the wire into the substrate 800. In case the wires should be insulated wires, the wire insulation should be resistant against the applied heat. The skilled person will appreciate that adjacent conductive wires may be embedded sequentially or concurrently into the substrate 800.

Figure 9:
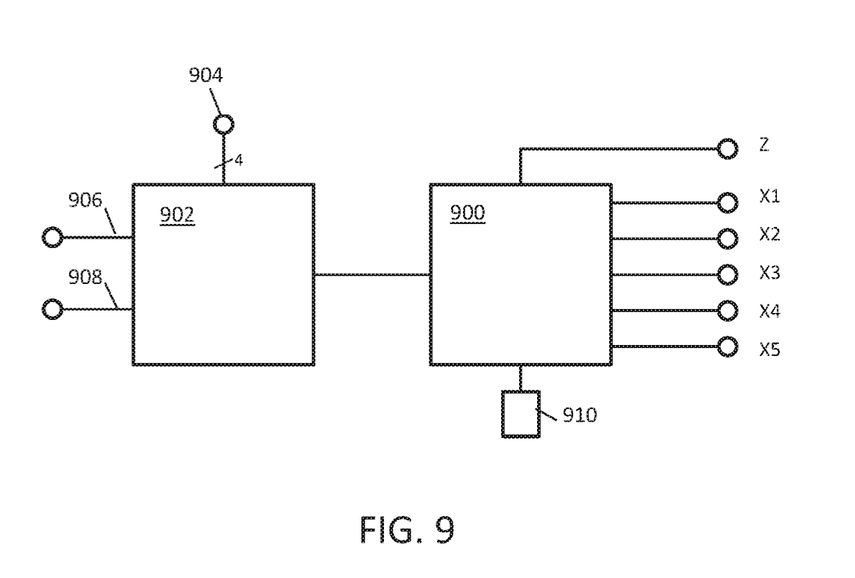
FIG. 9 shows an illustrative embodiment of a communication and processing module.

FIG. 9 shows an illustrative embodiment of a communication and processing module. FIG. 9 shows an example of a communication and processing module of the kind set forth. The communication and processing module comprises a first sub-module 902, which in turn may comprise a rectifier, a power supply, a communication interface unit and a secure element. Each of these features may be implemented by means of hardware components which are known as such, for example. The first sub-module 902 may comprise a first antenna terminal 906 and a second antenna terminal 908 for connection to an antenna. Furthermore, the first sub-module 902 may comprise a contact-interface terminal 904 for connection to a contact-interface, for example an interface based on the standard ISO-7816. The first sub-module 902 may exchange data with a second sub-module 900, which may comprise an input/output controller and a touch sensor position decoder. The second sub-module 900 may be arranged to control an optical feedback indicator 910 of the communication and processing module. Furthermore, the second sub-module 900 may be connected to sensor-specific signal lines corresponding to X1-, X2-, X3-, X4-, and X5-electrodes and to a common signal line corresponding to a Z-electrode. Since more than three electrodes may be connected to this communication and processing module, it may be used for processing signals which originate from more complex capacitive sensor structures than the structure shown in FIG. 2, for example. It is noted that the amount of sensor-specific signal lines shown merely represents an example. The components of the first sub-module 902 and the second sub-module 900 may be individual integrated components and discrete components or monolithically integrated components. As mentioned, an optical feedback indicator 910 may be included and may provide better user guidance during data entry. Alternatively or in addition, an acoustic feedback indicator may be used.

Figure 10:
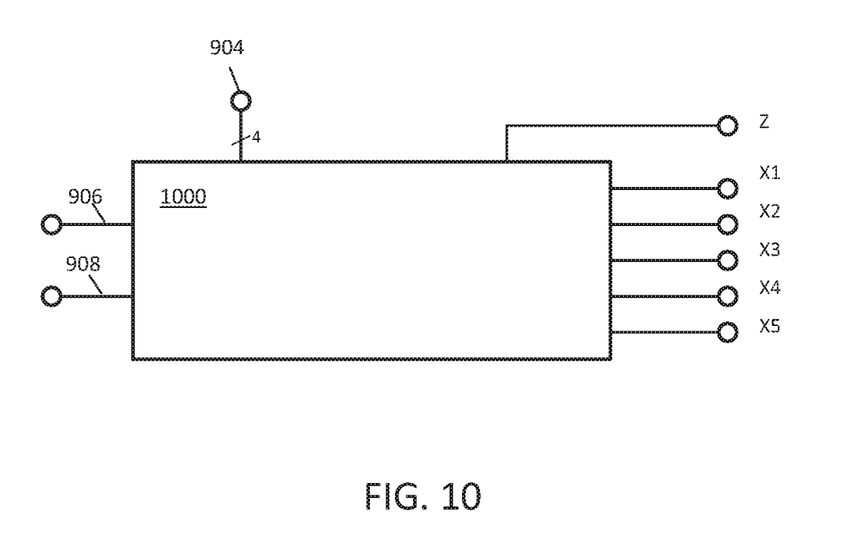
FIG. 10 shows a further illustrative embodiment of a communication and processing module.

FIG. 10 shows a further example of a processing module. In this example, the processing module comprises a monolithically integrated circuit 1000 comprising the rectifier, power supply, communication interface unit, secure element, input/output controller and touch sensor position decoder. In such a monolithically integrated version the user interface unit may function as a state machine that may control the required input/output function of the processing module.

Figure 11:
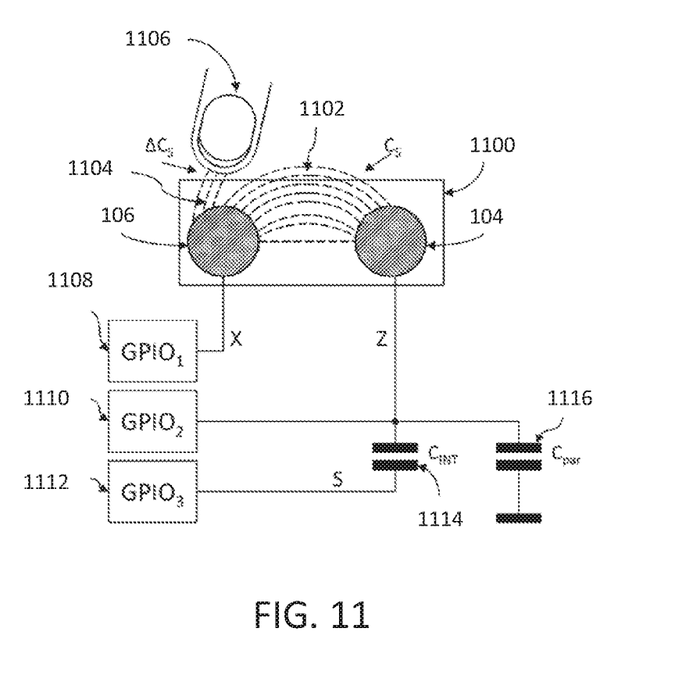
FIG. 11 shows an example of a sensing principle.

FIG. 11 shows an example of a sensing principle. In particular, it shows an example of how conductive wires 106, 104 of the kind set forth may be used to detect the proximity of an object, such as a human finger 1106. In this example, a pair of conductive wires 106, 104 has been embedded into anon-conductive substrate 1100. The conductive wires 106, 104 may be arranged in a pattern as shown in FIG. 1, for example. Sensing the proximity of the object may be enabled by generating an electrical fringe field 1102 between the first conductive wire 106 and the second conductive wire 104, which thus represent a capacitance $C_s$. The first conductive wire 106 functions as an X-electrode and the second conductive wire 104 functions as a Z-electrode. When an object comes into proximity 1104 of the first conductive wire 104, for example, the capacitance $C_s$ will change with a value $\Delta C_s$. The generation of the field and the detection of the capacitance change may be facilitated by components such as general-purpose input/output pins 1108, 1110, 1112, an integration capacitor 1114, and a parasitic capacitor 1116.

Figure 12:
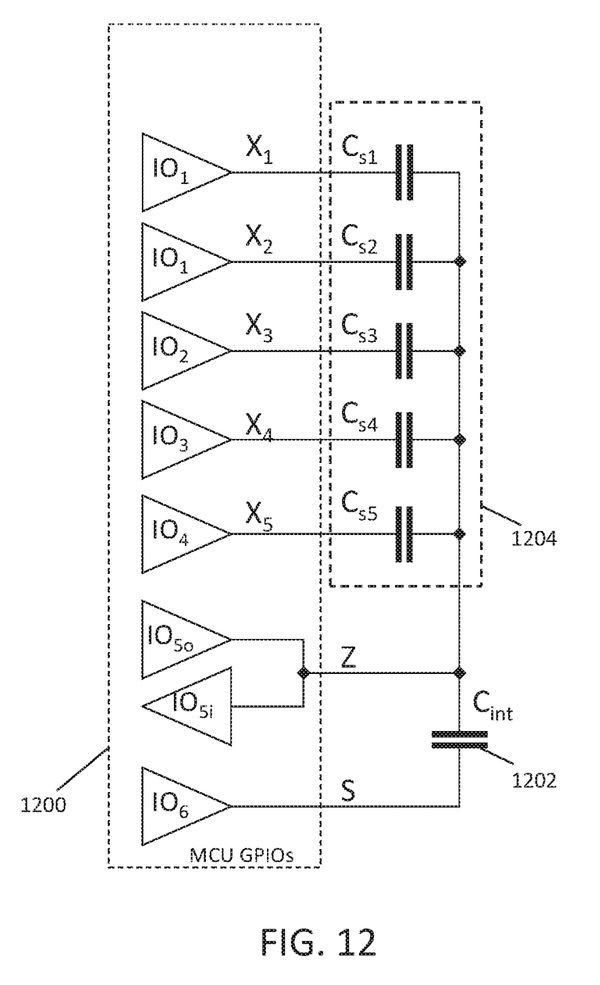
FIG. 12 shows an example of a multi-capacitor sensing device.

FIG. 12 shows an example of a multi-capacitor sensing device. In this example, a plurality 1204 of sensing capacitances may be evaluated. The individual sensing capacitances $C_{s1}$-$C_{s5}$ and the integration capacitor 1202 are connected to the general-purpose input/output pins 1200 of a computing device, such as microcontroller.

It is noted that the embodiments above have been described with reference to different subject-matters. In particular, some embodiments may have been described with reference to method-type claims whereas other embodiments may have been described with reference to apparatus-type claims. However, a person skilled in the art will gather from the above that, unless otherwise indicated, in addition to any combination of features belonging to one type of subject-matter also any combination of features relating to different subject-matters, in particular a combination of features of the method-type claims and features of the apparatus-type claims, is considered to be disclosed with this document.

Furthermore, it is noted that the drawings are schematic. In different drawings, similar or identical elements are provided with the same reference signs. Furthermore, it is noted that in an effort to provide a concise description of the illustrative embodiments, implementation details which fall into the customary practice of the skilled person may not have been described. It should be appreciated that in the development of any such implementation, as in any engineering or design project, numerous implementation-specific decisions must be made in order to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill.

Finally, it is noted that the skilled person will be able to design many alternative embodiments without departing from the scope of the appended claims. In the claims, any reference sign placed between parentheses shall not be construed as limiting the claim. The word "comprise(s)" or "comprising" does not exclude the presence of elements or steps other than those listed in a claim. The word "a" or "an" preceding an element does not exclude the presence of a plurality of such elements. Measures recited in the claims may be implemented by means of hardware comprising several distinct elements and/or by means of a suitably programmed processor. In a device claim enumerating several means, several of these means may be embodied by one and the same item of hardware. The mere fact that certain measures are recited in mutually different dependent claims does not indicate that a combination of these measures cannot be used to advantage.

LIST OF REFERENCE SIGNS 100 electronic device
102 capacitive sensor structure
104 conductive wire 106 conductive wire
108 communication and processing module
110 antenna
112 contact pad
114 contact pad
116 contact pad
118 contact pad
200 electronic device
202 capacitive sensor structure
204 conductive wire
206 conductive wire
208 communication and processing module
210 antenna
212 contact pad
214 contact pad
216 contact pad
218 contact pad
220 conductive wire
222 contact pad
404 insulated conductive wire
406 insulated conductive wire
700 milling tool
702 card body
704 insulation
706 conductive wire
800 non-conductive substrate
802 wire reservoir
804 computer-controlled nozzle
900 functional block
902 fractional block
904 contact interface
906 antenna interface
908 antenna interface
910 optical feedback unit
1000 functional block
1100 non-conductive substrate
1102 fringe field
1104 proximity
1106 finger
1108 general-purpose input/output pin
1110 general-purpose input/output pin
1112 general-purpose input/output pin
1114 integration capacitor
1116 parasitic capacitor
1200 general-purpose input/output pins
1202 integration capacitor
1204 sensing capacitances

The invention claimed is:

1. A smart card device comprising:
a non-conductive substrate formed of a thermoplastic material;
an antenna; and
a touch-based user interface having a capacitive sensor, wherein the capacitive sensor comprises conductive wires including adjacent insulated portions and other electrode-connection portions that are not insulated, the antenna and conductive wires being embedded in the thermoplastic material of the non-conductive substrate.

2. The smart card device as claimed in claim 1, further including a communication and processing circuit, wherein the smart card is characterized as a laminate including
a substrate layer having the non-conductive substrate formed of a thermoplastic material and in which the conductive wires are embedded;
an insulative layer secured directly over the substrate layer with the embedded conductive wires, wherein for a given application of heat applied to the non-conductive substrate from a side opposite an insulative substrate-adjacent layer while secured to the non-conductive substrate, the thermoplastic material is characterized as sufficiently thermally-sensitive to soften the thermoplastic material whereas the adjacent insulated portions of the conductive wires are characterized as being resistant against the applied heat; and
a smart-card body layer secured over the insulative layer;
wherein the smart-card body layer is formed with at least one opening in which the communication and processing circuit is located and which extends through the insulative layer to the other electrode-connection portions that are not insulated; and
wherein said capacitive sensor comprises an adjacent pair of the other portions of conductive wires embedded in the non-conductive substrate, and wherein each of said adjacent conductive wires functions as an electrode in the touch-based user interface.

3. The smart card device as claimed in claim 1, wherein at least some of said conductive wires are arranged in a meander pattern in which the adjacent insulated portions cross each other without causing shorts.

4. The smart card device as claimed in claim 1, wherein at least some of said conductive wires are arranged in a spiral pattern in which the adjacent insulated portions cross each other without causing shorts.

5. The smart card device as claimed in claim 1, wherein said capacitive sensor further comprises wire terminals embedded in milled openings of the non-conductive substrate.

6. The smart card device as claimed in claim 5, further comprising a communication and processing module having contact pads, wherein the wire terminals are connected to said contact pads, and wherein the contact pads and substrate are configured and arranged to, when the substrate is inserted into a slot of an external card reader, couple to one or more contact-interfaces of the external card reader and therein communicate one or more of data and power between the external card reader and the processing module.

7. The smart card device as claimed in claim 6, wherein the wire terminals have been prepared for connection to the contact pads by carrying out a milling process.

8. The smart card device as claimed in claim 1, wherein the conductive wires are made of the same material as said antenna.

9. The smart card device as claimed in claim 1, further including a communication and processing circuit, wherein the smart card is characterized as a laminate including
a substrate layer having the non-conductive substrate formed of a thermoplastic material and in which the conductive wires are embedded;
an insulative layer secured directly over the substrate layer with the embedded conductive wires, wherein for a given application of heat applied to the non-conductive substrate from a side opposite an insulative substrate-adjacent layer while secured to the non-conductive substrate, the thermoplastic material is characterized as sufficiently thermally-sensitive to soften the thermoplastic material whereas the adjacent insulated portions of the conductive wires are characterized as being resistant against the applied heat; and
a smart-card body layer secured over the insulative layer;
wherein the smart-card body layer is formed with at least one opening in which the communication and processing circuit is located and which extends through the insulative layer to the other electrode-connection portions that are not insulated; and wherein said capacitive sensor comprises multiple capacitive sensor circuits connecting to the communication and processing circuit and including the conductive wires, the multiple capacitive sensor circuits having a first wire, a second wire and a third wire arranged in patterns to sense a swipe movement of the smart card relative to an electronic device which is external to the smart card.

10. The smart card device as claimed in claim 1, wherein the conductive wires are copper wires.

11. The smart card device as claimed in claim 1, further including:
 a communication and processing module, including circuitry, configured and arranged with the conductive wires and the antenna for providing wireless communication and for processing signals from the conductive wires.

12. The smart card device as claimed in claim 1, further including a communication and processing module, including circuitry, configured and arranged with the conductive wires for detecting proximity of a human digit to the capacitive sensor using signals from the conductive wires.

13. The smart card device as claimed in claim 1,
 further including conductive contacts configured and arranged for contacting contact-interfaces of external card readers having a power source, upon placement of the conductive contacts of the smart card device in contact with one of the external card readers;
 wherein the touch-based user interface is configured and arranged to sense touches via the capacitive sensor, utilizing power provided by the power source and coupled via the conductive contacts; and
 further including a communication and processing circuit configured and arranged to communicate signals, based on touches sensed via the capacitive, utilizing the power provided by the power source and coupled via the conductive contacts.

14. The smart card device as claimed in claim 1, further including conductive contacts on a surface of the non-conductive substrate and configured and arranged for contacting to a contact-interface of an external power source upon placement of the conductive contacts of the smart card device in contact with the external power source, wherein the touch-based user interface is configured and arranged to sense touches via the capacitive sensor using power provided by the external power source.

15. The smart card device as claimed in claim 1, further including a communication and processing circuit, wherein the smart card is characterized as a laminate including
 a substrate layer having the non-conductive substrate formed of a thermoplastic material and in which the conductive wires are embedded,
 an insulative layer secured directly over the substrate layer with the embedded conductive wires, and
 a smart-card body layer secured over the insulative layer; and
 wherein the smart-card body layer is formed with at least one opening in which the communication and processing circuit is located and which extends through the insulative layer to the other electrode-connection portions that are not insulated.

16. The smart card device as claimed in claim 1, further including a communication and processing circuit, wherein the smart card is characterized as a laminate including:
 a substrate layer having the non-conductive substrate formed of a thermoplastic material and in which the conductive wires are embedded;
 an insulative layer secured directly over the substrate layer with the embedded conductive wires, wherein for a given application of heat applied to the non-conductive substrate from a side opposite the insulative substrate-adjacent layer while secured to the non-conductive substrate, the thermoplastic material is characterized as sufficiently thermally-sensitive to soften the thermoplastic material whereas the adjacent insulated portions of the conductive wires are characterized as being resistant against the applied heat; and
 a smart-card body layer secured over the insulative layer; and
 wherein the smart-card body layer is formed with at least one opening in which the communication and processing circuit is located and which extends through the insulative layer to the other electrode-connection portions that are not insulated.

17. The smart card device as claimed in claim 1, wherein the smart card is characterized as a laminate including
 a substrate layer having the non-conductive substrate formed of a thermoplastic material and in which the conductive wires are embedded,
 an insulative layer secured directly over the substrate layer with the embedded conductive wires, and
 a smart-card body layer secured over the insulative layer; and
 wherein the conductive wires and the capacitive sensor are configured into two capacitive sensor circuits by arranging the conductive wires horizontally, along a direction in or parallel to a plane of one of the layers of the laminate, to form a first horizontal-plane section corresponding to one of the two capacitive sensor circuits, to form a second horizontal-plane section corresponding to another of the two capacitive sensor circuits, and to form a third horizontal-plane section corresponding to both of the two capacitive sensor circuits.

18. The smart card device as claimed in claim 1, wherein the smart card is characterized as a laminate including
 a substrate layer having the non-conductive substrate formed of a thermoplastic material and in which the conductive wires are embedded,
 an insulative layer secured directly over the substrate layer with the embedded conductive wires, and
 a smart-card body layer secured over the insulative layer; and
 the conductive wires and the capacitive sensor being patterned and configured to form a plurality of capacitive sensor circuits by an arrangement of the conductive wires and to form a plurality of the other electrode-connection portions of the touch-based user interface, and
 the patterned conductive wires and the other electrode-connection portions of the touch-based user interface being horizontally patterned, along a direction in or parallel to a plane of one of the layers of the laminate and in sufficient proximity to a side of the laminate, opposite the substrate layer, to sense a change in capacitance due to an electrical field caused by an object, external to the smart card device, moving toward or reaching the side of the laminate opposite the substrate layer.

19. A method of manufacturing a smart card device, the method comprising:
 embedding insulated conductive wires into a first layer of the smart card device which is non-conductive substrate that includes a thermoplastic material, laminating by forming an insulative body layer over the embedding insulated conductive wires and the non-conductive substrate;

milling one or more openings into the insulative body layer to remove insulation in portions of the insulated conductive wires and to provide a cavity; and inserting communication and processing circuitry into the cavity and connecting the communication and processing circuitry to certain of the portions of the insulated conductive wires and therein providing a touch-based user interface having a capacitive sensor formed by the embedded conductive wires and operable with communication and processing circuitry; and wherein the first layer and the insulative body layer are layers of a laminate and the embedded conductive wires are patterned and configured to provide at least portions of the touch-based user interface and a horizontal arranged regions, along a plane parallel to one of the layers, of a capacitive sensor configured to interact with an external electronic device by a swiping motion.

20. The method of claim 19, wherein the insulated portions of the conductive wires are more heat resistant than the thermoplastic material of the substrate and wherein embedding the conductive wires into the non-conductive substrate further includes:

applying the conductive wires to the non-conductive substrate under an application of heat and force.

21. The method of claim 20, further including applying heat on a wire-application side of the non-conductive substrate and applying heat on an underneath side of the non-conductive substrate.

22. The method of claim 19, further including forming contacts on a surface of the non-conductive substrate, the contacts being configured and arranged to provide power from a contact-interface an external power supply to the touch-based user interface in response to the smart card device and the contacts being placed in contact with the external power supply.

23. A method of manufacturing a smart card device, the method comprising:

providing as a substrate layer of the smart card device, a non-conductive substrate formed of a thermoplastic material;

in a laminating step, providing a card body layer as another layer of the smart card device and thereby forming a laminate;

embedding conductive wires into the thermoplastic material of the non-conductive substrate by a process which includes applying heat to the conductive wires and to thermoplastic material during the step of embedding, and therefrom provide a touch-based user interface, the non-conductive substrate having a capacitive sensor including as least portions of the embedded conductive wires and being configured with the touch-based user interface for enabling a user to interact with the smart card device in response to capacitance changes sensed through the embedded conductive wires;

milling an opening through the card body layer and sufficiently into the laminate to partially remove insulation of the conductive wires and therefrom form at least one wire terminal and a cavity for a communication and processing module that includes circuitry;

inserting the communication and processing module into the cavity; and connecting at least one communication pad of the communication and processing module to the conductive wires.

* * * * *